United States Patent
Taito et al.

(10) Patent No.: US 6,373,763 B1
(45) Date of Patent: Apr. 16, 2002

(54) SEMICONDUCTOR MEMORY PROVIDED WITH DATA-LINE EQUALIZING CIRCUIT

(75) Inventors: Yasuhiko Taito; Akira Yamazaki; Fukashi Morishita; Nobuyuki Fujii; Mako Okamoto, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/839,403

(22) Filed: Apr. 23, 2001

(30) Foreign Application Priority Data

Oct. 30, 2000 (JP) ............................. 12-330165

(51) Int. Cl.$^7$ ............................................. G11C 7/00
(52) U.S. Cl. .............. 365/203; 365/189.09; 365/230.06
(58) Field of Search ........................... 365/203, 189.09, 365/189.11, 230.06, 202, 149

(56) References Cited

U.S. PATENT DOCUMENTS 6,072,739 A * 6/2000 Kokubo ...................... 365/203

FOREIGN PATENT DOCUMENTS

JP 7-130175 5/1995
JP 8-31171 2/1996

* cited by examiner

*Primary Examiner*—David Nelms
*Assistant Examiner*—David Lam
(74) *Attorney, Agent, or Firm*—McDermott, Will & Emery (57) ABSTRACT

An equalizing circuit includes a plurality of N-channel MOS transistors for respectively setting a data line to a predetermined precharge voltage. The H-level voltage Vddb of a control signal for turning on these N-channel MOS transistors is set to a range higher than the sum of the precharge voltage and a transistor threshold voltage. A Vddb generation circuit steps up an external power-supply voltage and sets a voltage Vddb in a range lower than a step-up voltage for activating a word line.

16 Claims, 9 Drawing Sheets

SEMICONDUCTOR MEMORY PROVIDED WITH DATA-LINE EQUALIZING CIRCUIT

BACKGROUND OF THE INVENTION

1. Field of the Invention

The present invention relates to a semiconductor memory, particularly to a semiconductor memory provided with a data-line equalizing circuit for setting each data line constituting a data-line pair to the same predetermined voltage before reading data from a memory cell.

2. Description of the Background Art

In the case of a dynamic random access memory (DRAM), the equalizing operation for setting each data line constituting a data-line pair for transferring stored data to the same predetermined voltage is performed before reading data from a memory cell.

Figure 12:
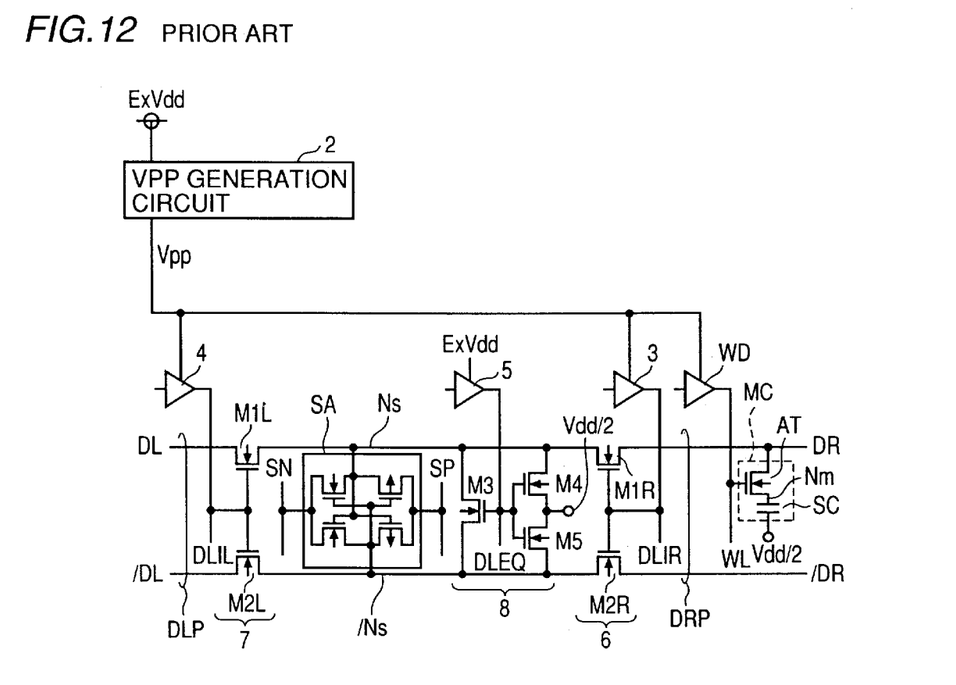
FIG. 12 is a circuit diagram showing a configuration of the circumference of a data-line equalizing circuit of a conventional DRAM.

FIG. 12 is a circuit diagram showing a configuration of the circumference of a data-line equalizing circuit (hereafter also merely referred to as equalizing circuit) of a conventional DRAM.

Referring to FIG. 12, a memory cell MC for keeping stored data has an access transistor AT and a storage capacitor SC for keeping a voltage level of a data storage node Nm.

FIG. 12 shows the so-called shared-sense-amplifier configuration, and a sense-amplifier circuit SA is shared by data-line pairs DRP and DLP separately arranged. The stored data of one memory cell MC typically shown in FIG. 12 is transferred by the data-line pair DRP. The data-line pair DRP has a data line DR electrically connected with a data storage node Nm in the memory cell MC through the access transistor AT and a data line /DR for transferring the data complementary with the data line DR. Similarly, the data-line pair DLP has a data lines DL and /DL for transferring the data complementary with each other.

In the case of a DRAM conforming to the shared-sense-amplifier configuration, switching circuits 6 and 7 for connecting/disconnecting two data-line pairs DRP and DLP with/from the sense-amplifier circuit SA are set between the pairs DRP and DLP on one hand and the circuit SA on the other. The switching circuits 6 and 7 are respectively constituted of an N-channel MOS transistor. Specifically, the switching circuit 6 has N-channel MOS transistors M1L and M2R receiving a control signal DLIR by their gates. Similarly, the switching circuit 7 has N-channel MOS transistors M1L and M2L receiving a control signal DLIL by their gates.

The data-line pairs DRP and DLP further share an equalizing circuit 8. The equalizing circuit 8 has an N-channel MOS transistor M3 for connecting both data lines constituting a data-line pair and N-channel MOS transistors M4 and M5 for connecting each data line constituting a data-line pair with a predetermined precharge-voltage (Vdd/2) node. A data-line-equalizing signal DLEQ is input to gates of the transistors M3, M4, and M5.

A precharge voltage is generally set to Vdd/2 which is an intermediate voltage between a power-supply voltage Vdd corresponding to H level of stored data and a ground voltage Vss corresponding to L level of the stored data in order to reduce the power consumption and noises accompanying charge/discharge of a data line.

An external power-supply voltage ExVdd is supplied to a DRAM from the outside of a chip. A power-supply voltage Vdd stepped down from ExVdd by a not-illustrated VDC (Voltage Down Converter) or a step-up voltage Vpp (Vpp>Vdd) stepped up from ExVdd by a Vpp generation circuit 2 are generated in the DRAM.

The transistors used for switching circuits 6 and 7, equalizing circuit 8, and access transistor AT are frequently respectively constituted of only an N-channel MOS transistor in order to reduce an area. In this case, to transfer the power-supply voltage Vdd corresponding to H level of stored data, it is necessary to set the gate voltage of an N-channel MOS transistor to Vdd+Vth (Vth: threshold voltage of N-channel MOS transistor) or higher.

Therefore, the step-up voltage Vpp (Vpp>Vdd) is used for each H-level potential of control signals DLIR and DLIL input to the gate of an N-channel MOS transistor constituting the switching circuits 6 and 7. Specifically, the control signals DLIR and DLIL are generated by signal buffers 3 and 4 driven by the step-up voltage Vpp.

Also for a word line WL for turning on the access transistor AT, an activated voltage level is set to the step-up voltage Vpp by a word-line driver WD driven by the step-up voltage Vpp.

It is only necessary for the N-channel MOS transistors M3 to M5 constituting the equalizing circuit 8 to transfer the precharge voltage Vdd/2 of a data line. Therefore, it is unnecessary to use a step-up voltage for a voltage when a data-line equalizing signal DLEQ input to gates of these transistors is activated, that is, an H-level voltage as long as the H-level voltage meets the following expression (1).

$$ExVdd > Vth + Vdd/2 \qquad (1)$$

Therefore, a signal buffer 5 for generating the data-line equalizing signal DLEQ is driven by the external power-supply voltage ExVdd, and the H-level voltage of the data-line equalizing signal DLEQ has been generally set to ExVdd.

Figure 13:
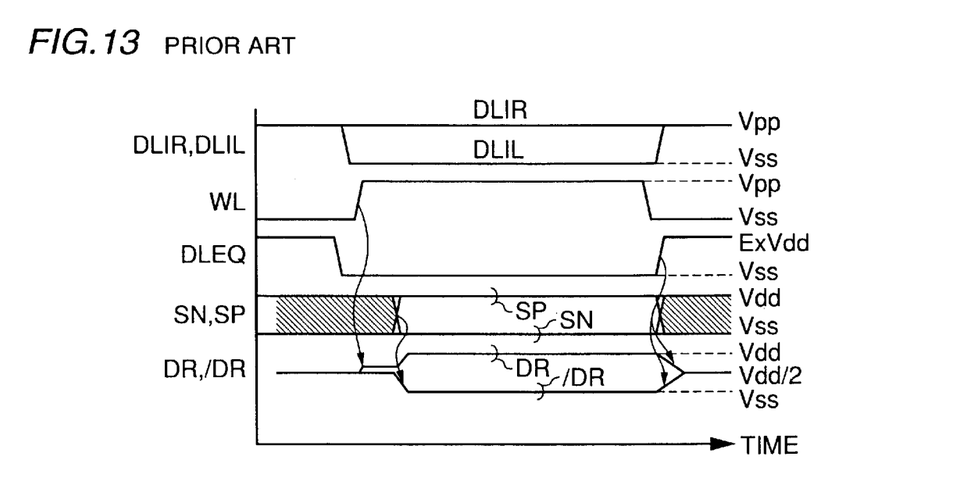
FIG. 13 is a timing chart for explaining the data read operation of the DRAM shown in FIG. 12.

FIG. 13 is a timing chart for explaining the data read operation of the DRAM shown in FIG. 12.

Referring to FIG. 13, the data-line equalizing signal DLEQ and control signals DLIR and DLIL are respectively activated to an H-level voltage before data is read. As already described, H-level voltages of the control signals DLIR and DLIL are respectively equal to the step-up voltage Vpp, and the H-level voltage of the data-line equalizing signal DLEQ is equal to ExVdd.

Thereby, the transistors M1R, M1L, M2R, M2L, and M3 to M5 constituting the switching circuits 6 and 7 and the equalizing circuit 8 are all turned on. As a result, the data lines DR and /DR are set to the same precharge voltage Vdd/2. Data lines DL/DL are also set to the same precharge voltage Vdd/2 (not shown). Thus, the equalizing operation of a data line is executed before the data read operation.

When the data read operation is started, either of the switching circuits 6 and 7 is turned on and only one data-line pair is connected with the sense amplifier SA. In FIG. 13, to disconnect the data-line pair DLP from the sense amplifier SA, the transistors M1L and M2L constituting the switching circuit 7 are turned off in response to inactivation (to L-level voltage Vss) of the control signal DLIL.

Similarly, the data-line equalizing signal DLEQ is inactivated to the L-level voltage (Vss), and the transistors M3 to M5 constituting the equalizing circuit 8 are turned off.

Under the above state, the word line WL is activated to the H-level voltage (step-up voltage Vpp). In response to the above operation, the access transistor AT is turned on, and the data storage node Nm is connected with the data line DR. FIG. 13 shows a case in which the memory cell MC keeps H-level data. Therefore, the voltage level of the data line DR is slightly stepped up by electric charges stored in the storage capacitor SC in response to turn-on of the access transistor AT. However, the voltage level of the complementary data line /DL is kept at the precharge voltage Vdd/2.

Thereafter, the sense-amplifier circuit SA is further activated and voltage levels of power-supply nodes SP and SN are set to the power-supply voltage Vdd and ground voltage Vss. Thereby, a minute voltage difference generated between the data lines DR and /DR is amplified, and voltage levels of the data lines DR and /DR are set to Vdd and Vss. Thus, data is normally read from the DRAM by assuming the normal equalizing operation of the data lines.

As described above, the data-line-equalizing signal DLEQ for controlling the equalizing circuit 8 is generally driven by the external power-supply voltage ExVdd.

Recently, however, a DRAM is frequently mounted on portable information terminal units that have been rapidly spread. It is requested for these portable information terminal units to operate for a long time by a battery having a limited power-supply capacity. Therefore, it is requested that the power consumption of an electronic device mounted on a portable information terminal unit is minimized. Because the power consumption of an electronic device is almost proportional to the second power of an operating power-supply voltage, it is effective to lower a power-supply voltage for reduction of power consumption. Therefore, it is strongly requested for a DRAM to lower the external power-supply voltage ExVdd supplied from an external unit.

However, there is a problem in simply lowering the power-supply voltage Vdd in a DRAM in accordance with lowering of the external power-supply voltage ExVdd. The electric-charge quantity stored in the memory cell MC correspondingly to stored data is decided by the product of the capacitance of the storage capacitor SC and the power-supply voltage Vdd. Therefore, when lowering the power-supply voltage Vdd, the electric-charge quantity stored in the memory cell MC decreases and is subject to the influence of noises or the like. Moreover, because the power-supply voltage Vdd is also used for the driving power-supply voltage of the sense-amplifier circuit SA, when lowering the power-supply voltage Vdd, operations of the sense-amplifier circuit SA are decelerated and it is difficult to accelerate data read.

Moreover, it is difficult to simply lower the threshold voltage Vth of an N-channel MOS transistor correspondingly to lowering of the external power-supply voltage ExVdd. This is because by lowering the threshold voltage Vth, a leak current (subthreshold current) increases, when the access transistor AT is turned off and electric charges stored in the memory cell MC are easily lost. As a result, it is necessary to shorten a refresh cycle and thereby, power consumption increases.

Because of these factors, when keeping the H-level voltage of the data-line equalizing signal DLEQ at the external power-supply voltage ExVdd, gate voltages of the transistors M3 to MS constituting the equalizing circuit 8 cannot meet the above expression (1) as the external power-supply voltage ExVdd lowers. Thereby, it is impossible to sufficiently transfer the precharge voltage Vdd/2 by the transistors M3 to M5. As a result, it is impossible to normally execute the precharge operation of a data line before the data read operation and thereby, data may not be normally read.

SUMMARY OF THE INVENTION

It is an object of the present invention to provide a semiconductor-memory configuration capable of normally executing the equalizing operation of a data line by an N-channel MOS transistor even if an external power-supply voltage is lowered.

In short, the present invention is a semiconductor device operating with an external power-supply voltage, which is provided with first and second data lines, a plurality of memory cells, and a data-line equalizing circuit. The first and second data lines transmit a data signal having two data levels. One of the data levels of the data signal corresponds to a first voltage. The memory cells hold the stored data. Each memory cell includes a storage node for storaging the data level of the data signal and a data transfer gate for electrically connecting the storage node with either of the first and second data lines in response to activation of a word line set to a second voltage higher than the first voltage. The data-line equalizing circuit sets the first and second data lines to the same predetermined voltage in response to a control signal. The control signal is set to a third voltage higher than the external power-supply voltage but lower than the second voltage when activated.

Another aspect of the present invention is a semiconductor device operating with an external power-supply voltage, which is provided with first and second data lines, first and second voltage generation circuits, a plurality of memory cells, and a data-line equalizing circuit. The first and second data lines transmit a data signal having two data levels. One of data levels of the data signal corresponds to a first voltage. The first internal-voltage generation circuit receives the external power-supply voltage and generates a first internal voltage higher than the first voltage. The second internal-voltage generation circuit receives the external power-supply voltage and outputs a second internal voltage higher than the external power-supply voltage but lower than the first internal voltage. The memory cells hold stored data. Each memory cell includes a storage node for storaging the data level and a first data transfer gate for electrically connecting the storage node with either of the first and second data lines in response to activation of a word line set to the first internal voltage. The data-line equalizing circuit sets the first and second data lines to the same predetermined voltage in response to an equalizing control signal. The equalizing control signal is set to the second internal voltage when activated.

Still another aspect of the present invention is a semiconductor device which is provided with a memory cell, a data line pair, a word line, a sense-amplifier circuit, and a data-line equalizing circuit. The memory cell includes a capacitor for storing charges and an access transistor. The data line pair includes two data lines. One of the two data lines is connected to the memory cell. The word line is connected to the gate of the access transistor and is set to a first voltage under activation. The sense-amplifaier circuit amplifies a small voltage difference between the two data lines to a voltage difference between the ground voltage and a second voltage. The small voltage difference is generated representing the stored charges in the capacitor in response to the activation of the word line. The data-line equalizing circuit sets each of the two data lines to one same predetermined voltage in response to a control signal. The control signal is set to a third voltage higher than an external power-supply voltage and lower than the first voltage under activation.

Therefore, the main advantage of the present invention lies in the fact that it is possible to normally execute the precharge and equalizing operations of the first and second data lines by setting the level of a control signal to a proper voltage when activated without using an excessively-high voltage even if an external power-supply voltage is lowered.

Moreover, because the second internal voltage used as a step-up voltage is lower than the first internal voltage for activating a word line, it is possible to downsize the second internal-voltage generation circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are described below by referring to the accompanying drawings.

First Embodiment

Figure 1:
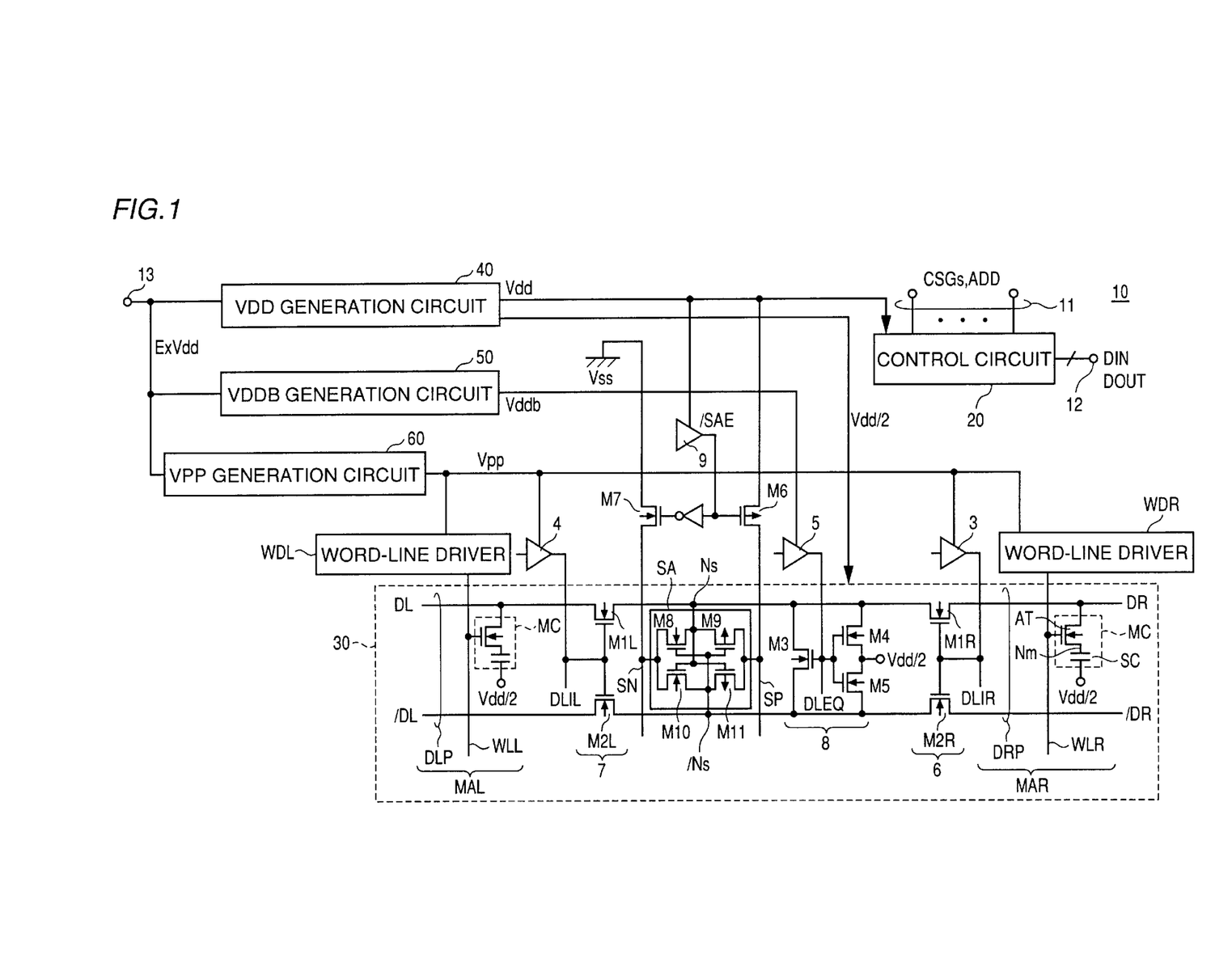
FIG. 1 is a block diagram showing a configuration of a semiconductor memory according to a first embodiment of the present invention.

Referring to FIG. 1, the semiconductor device 10 according to the first embodiment is provided with a signal input terminal 11 for receiving a command control signal CSGs and an address signal ADD, a data input/output terminal 12 for inputting/outputting write data DIN and read data DOUT, a control circuit 20 for controlling all operations of the semiconductor device 10 in response to inputs of the command control signal CSGs and address signal ADD, and a memory array section 30 having a plurality of memory cells MC arranged in a matrix.

The semiconductor device 10 is further provided with a power-supply input terminal 13 for receiving an external power-supply voltage ExVdd, an internal Vdd generation circuit 40 for stepping down the external power-supply voltage ExVdd and generating a first internal power-supply voltage Vdd, a Vddb generation circuit 50 for stepping up the external power-supply voltage ExVdd and generating a second internal power-supply voltage Vddb, and a Vpp generation circuit 60 for stepping up the external power-supply voltage ExVdd and generating a step-up voltage Vpp.

Levels of the external power-supply voltage ExVdd, first internal power-supply voltage Vdd, second internal power-supply voltage Vddb, and step-up voltage Vpp are set so that the following expression (2) is effectuated.

$$Vdd<ExVdd<Vddb<Vpp \qquad (2)$$

Hereafter, the Vddb generation circuit 50 and Vpp generation circuit 60 are respectively generally referred to as "step-up circuit". Moreover, H-and L-level voltages of stored data correspond to the first internal power-supply voltage Vdd and ground voltage Vss.

The memory array section 30 has a plurality of memory cells MC arranged like a matrix. Each memory cell MC has an access transistor AT and a storage capacitor SC to store electric charges corresponding to the level of stored data in a data storage node Nm.

The memory array section 30 has the so-called shared sense-amplifier structure and is divided into two areas MAL and MAR. FIG. 1 typically shows one memory cell MC and a word line pair and a data line pair corresponding to the memory cell MC in the areas MAR and MAL respectively.

In the areas MAR and MAL respectively, a word line is set correspondingly to each row of the memory cell MC and a data line pair is set correspondingly to each column of the cell MC. In FIG. 1, a data line pair DRP constituted of data lines DR and /DR and a word line WLR are shown in the area MAR. Similarly, a data line pair DLP constituted of data lines DL and /DL and a word line WLL are typically shown in the area MAL.

The data line pairs DRP and DLP shown in FIG. 1 correspond to a bit line pair corresponding to each memory cell string in DRAM. However, the object of the equalizing operation of a data line according to the present invention described below is not restricted to a bit line pair. That is, the equalizing operation of a data line according to the present invention can be also applied to a data I/O line pair and a data bus pair hierarchically set with a bit line pair in order to transfer stored data.

The sense-amplifier circuit SA is shared by the data line pairs DLP and DRP to amplify the voltage level difference between sense-amplifier nodes Ns and /Ns. The driving power-supply voltage of the sense-amplifier circuit SA is supplied to power-supply nodes SP and SN.

The power-supply node SP is electrically connected with a node for supplying the first internal power-supply voltage Vdd through a P-channel MOS transistor M6. The power-supply node SN is connected with a ground voltage (Vss) node through an N-channel MOS transistor M7. A sense-amplifier activation signal /SAE is input to the gate of the transistor M6 and an inversion signal of the sense-amplifier activation signal /SAE is input to the gate of the transistor M7.

When the sense-amplifier circuit SA is activated, the sense-amplifier activation signal /SAE is activated to the L-level voltage (Vss). Correspondingly to the activation of the signal /SAE, the gate voltage of the transistor M7 is set to the first internal power-supply voltage Vdd and the gate voltage of the transistor M6 is set to the ground voltage Vss. Thereby, the first internal power-supply voltage Vdd and ground voltage Vss are supplied to the power-supply nodes SP and SN.

When the sense-amplifier activation signal /SAE is activated, that is, when a driving power-supply voltage is supplied to the power-supply nodes SP and SN, the sense-amplifier circuit SA by the transistors M8 to M11 amplifies the voltage difference between the sense-amplifier nodes Ns and /Ns and sets voltage levels of the sense-amplifier nodes Ns and /Ns to either of the first internal power-supply voltage Vdd and ground voltage Vss respectively.

The memory array section 30 further has switching circuit 6 for connecting/disconnecting the sense-amplifier node Ns and /Ns with/from the data line DR and /DR constituting data-line pairs DRP, switching circuit 7 for connecting/disconnecting the sense amplifier node Ns and /Ns with/from the data line DL and /DL constituting data-line pairs DLP, and an equalizing circuit 8 to be shared by the data line pairs DLP and DRP.

As already described, the switching circuits 6 and 7 and the equalizing circuit 8 are respectively constituted of an N-channel MOS transistor in order to reduce an area. Moreover, an N-channel MOS transistor is similarly applied to the access transistor AT in the memory cell MC.

Therefore, control signals DLIR and DLIL to be input to gates of the N-channel MOS transistors constituting the switching circuits 6 and 7 are generated by the signal buffers 3 and 4 driven by the step-up voltage Vpp. Similarly, word-line drivers WDR and WDL for activating the word lines WLR and WLL connected with the gate of the access transistor AT to the Hlevel voltage are driven by the step-up voltage Vpp.

Thereby, when the control signals DLIR and DLIL and the word lines WLR and WLL are activated, the H-level voltage becomes the step-up voltage Vpp. The step-up voltage Vpp is generated by the Vpp generation circuit 60 so that the level of the voltage Vpp meets the following expression (3) in accordance with the threshold voltage Vth of an N-channel MOS transistor.

$$Vpp > Vdd + Vth \tag{3}$$

Therefore, these N-channel MOS transistors make it possible to normally transfer the first internal power-supply voltage Vdd corresponding to the H level of stored data.

A signal buffer 5 for generating a data-line equalizing signal DLEQ is driven by the second internal power-supply voltage Vddb generated by the Vddb generation circuit 50. Thereby, the H-level voltage of the data-equalizing signal DLEQ when activated is set to the second internal power-supply voltage Vddb.

In this case, the second internal power-supply voltage Vddb is set so as to meet the following expression (4) in addition to the above expression (2).

$$Vddb > Vth + Vdd/2 \tag{4}$$

By setting the H-level voltage when the data-line equalizing signal DLEG is activated so as to meet the expression (4), it is possible to execute the equalizing operation of a data line even if an external power-supply voltage ExVdd supplied from an external unit is lowered.

Though there are various configurations of a step-up circuit that can be used as a Vddb generation circuit 50, a charge-pump-type step-up circuit is shown for this embodiment.

Figure 2:
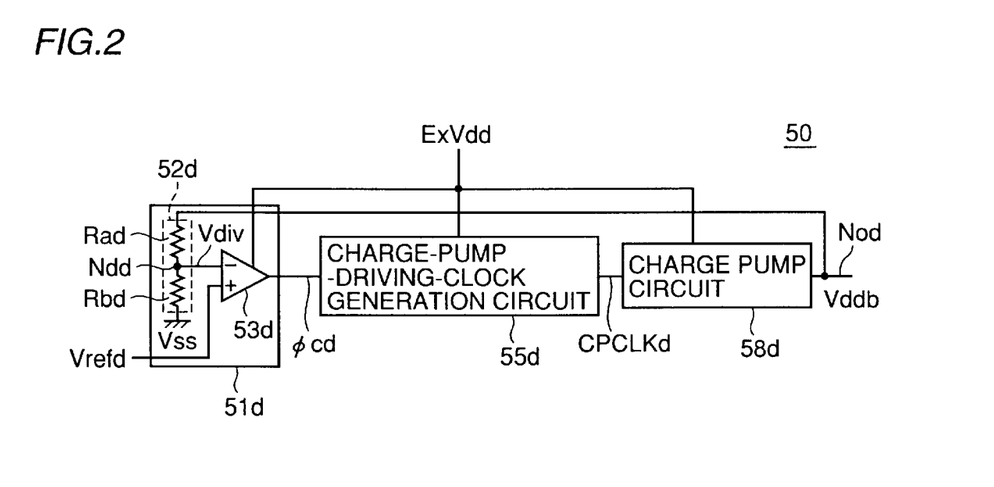
FIG. 2 is a circuit diagram showing an outline of configuration of a Vddb generation circuit shown in FIG. 1.

Referring to FIG. 2, the Vddb generation circuit 50 includes a voltage detection circuit 51d, a charge-pump-driving-clock generation circuit 55d, and a charge pump circuit 58d for generating the second internal power-supply voltage Vddb by the charge-pump operation.

The voltage detection circuit 51d has a voltage-dividing circuit 52d for dividing the second internal power-supply voltage Vddb generated by an output node Nod and outputting the divided voltage Vddb to a node Ndd and a differential amplifier circuit 53d for comparing a voltage Vdiv of the node Ndd with a reference voltage Vrefd.

The voltage-dividing circuit 52d has a resistance component Rad connected between the output node Nod and the node Ndd and a resistance component Rbd connected between the node Ndd and the ground voltage (Vss) in series. Thereby, the voltage Vdiv output to the voltage-divided node Ndd is expressed by Vdiv=Vddb·{Rbd/Rad+Rbd)}.

The differential amplifier 53d activates a charge-pump activation signal Φcd when the second internal power-supply voltage Vddb becomes lower than a predetermined voltage level in accordance with the Vrefd.

The charge-pump-driving-clock generation circuit 55d generates a charge-pump-driving clock CPCLKd for driving the charge pump circuit 58d in response to activation of the charge-pump activation signal Φcd. The charge-pump-driving clock CPCLKd has a predetermined constant frequency fo.

The charge-pump circuit 58d receives the charge-pump-driving clock CPCLKd and steps up the external power-supply voltage ExVdd by the charge-pump operation to generate the second internal power-supply voltage Vddb.

Figure 3:
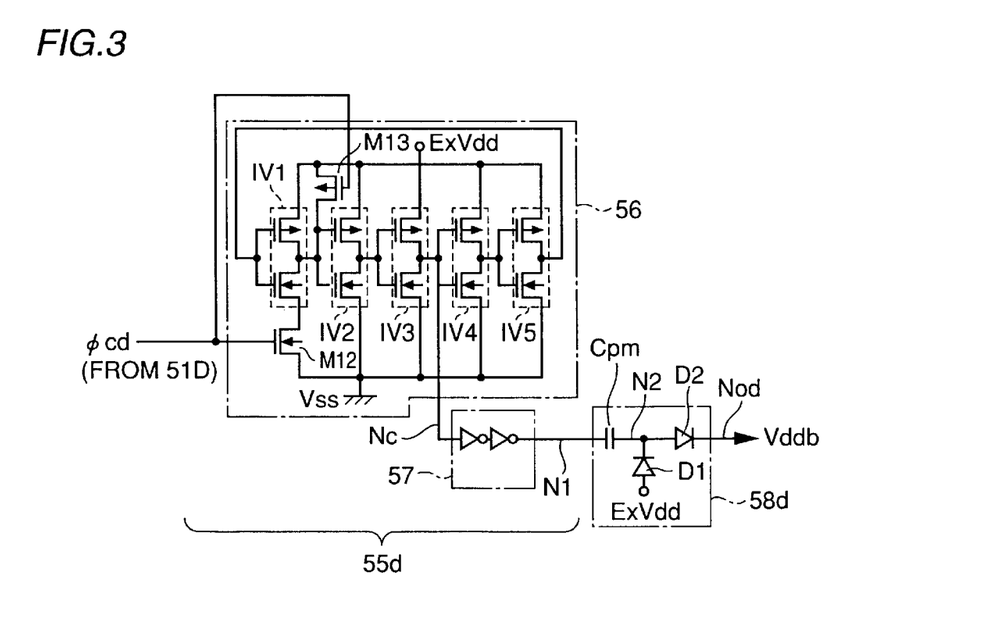
FIG. 3 is a circuit diagram of a Vddb generation circuit in detail.

Referring to FIG. 3, the charge-pump-driving-clock generation circuit 55d has a clock oscillator 56 and a buffer circuit 57. A five-stage-ring oscillator having the simplest configuration is shown as the clock oscillator 56.

That is, the clock oscillator 56 has five CMOS inverters IV1, IV2, IV3, IV4, and IV5 each constituted of a P-channel MOS transistor and an N-channel MOS transistor. The CMOS inverters IV1 to IV5 are multistage-connected and the output of the final-stage inverter IV5 is fed back to the input of the initial-stage inverter IV1.

The clock oscillator 56 is further provided with an N-channel MOS transistor M12 which is further electrically connected between the source of the N-channel MOS transistor in the initial-stage inverter IV1 and the ground voltage (Vss) node and to whose gate the charge-pump activation signal Φcd is input from the voltage detection circuit 51d.

The clock oscillator 56 has a P-channel MOS transistor M13 which is further electrically connected between the input node of the second-stage inverter IV2 and the external power-supply voltage (ExVdd) node and to whose gate the charge-pump activation signal ΦDcd is input.

The output of any-stage inverter of the multistage-connected inverters of the clock oscillator 56 such as the out of the third-stage inverter IV3 is transferred to a node Nc and supplied to the buffer circuit 57. The buffer circuit 57 is constituted of, for example, two inverters connected in series to supply the charge-pump-driving clock CPCLKd to a node N1.

The charge-pump circuit 58d has a general configuration including a pump capacitor Cpm, a diode D1 connected between the external power-supply(ExVdd) node and a node N2 when assuming the direction from the external power-supply (ExVdd) node toward the node N2 as the forward direction, and a diode D2 connected between the node N2 and an output node Nod when assuming the direction from the node N2 toward the output node Nod as the forward direction. It is also possible to use a diode-connected MOS transistor instead of the diodes DI and D2.

By using the above configuration, when the charge-pump activation signal Φcd output from the voltage detection circuit 51d is inactivated to the L-level voltage, the N-channel MOS transistor M12 connected to the initial-stage inverter IV1 in the clock oscillator 56 is turned off. Thereby, because an operating current does not flow through the inverter IV1, the oscillating operation is not performed by the clock oscillator 56. In this case, because the P-channel MOS transistor M13 connected to the second-stage inverter IV2 is turned on, the initial value of an input signal of the second-stage inverter IV2 is fixed to H level.

Then, when the charge-pump activation signal Φcd is activated to the H-level voltage, the oscillating operation of the clock oscillator 56 is started. That is, because the N-channel MOS transistor M12 is turned on in response to the H-level voltage of the charge-pump activation signal Φcd, an operating current is supplied to the inverter IV1. In this case, because the initial value of an input signal of the second-stage inverter IV2 is previously set to H level, an output signal of the final-stage inverter IV5 is set to H level. Therefore, the inverter IV1 operates and thereby, an output signal of the final-stage inverter IV5 is inverted and supplied to the secondstage inverter IV2. In this case, because the P-channel MOS transistor M13 is turned off in response to activation of the charge-pump activation signal Φcd, input signals to the second-stage inverter IV2 are sequentially inverted and the oscillating operation occurs.

Therefore, the N-channel MOS transistor M12 controlled in accordance with the charge-pump activation signal Φcd functions as a switch for controlling the oscillating operation. The P-channel MOS transistor M13 functions as a switch for providing an initial value to each inverter when the oscillating operation is stopped. The MOS transistor M13 is not always necessary. It is also possible to omit the transistor M13.

The buffer circuit 57 is set to supply a current enough to drive the pump capacitor Cpm in the charge pump circuit 58d in accordance with an oscillation signal obtained by the clock oscillator 56, that is, the charge-pump-driving clock CPCLKd.

In the case of the charge pump circuit 58d, when the charge-pump-driving clock CPCLKd falls from the H-level voltage (ExVdd) to the L-level voltage (Vss), the diode D1 functions so as to supply positive electric charges from the external power-supply voltage (ExVdd) node to the pump capacitor Cpm but prevent the flow of electric charges when the charge-pump-driving clock CPCLKd rises from L level to H level.

Similarly, the diode D2 functions so as to prevent the flow of electric charges sent from the output node Nod when the charge-pump-driving clock CPCLKd falls from the H-level voltage to the L-level voltage but supply positive electric charges from the pump capacitor Cpm to the output node Nod when the charge-pump-driving clock CPCLKd rises from the L-level voltage to the H-level voltage. Therefore, because positive electric charges flow from the external power-supply voltage (ExVdd) node toward the output node Nod for generating the second internal power-supply voltage Vddb, the second internal power-supply voltage Vddb becomes higher than the external power-supply voltage ExVdd.

A current supply capacity Iout of the Vddb generation circuit 50 constituted as described above is shown by the following expressions (5) and (6) by using proportionality factor k (k: real number), frequency fo of charge-pump-driving clock CPCLKd, pump capacitor Cpmp, and forward voltage drop Vdw of diodes D1 and D2.

$$Iout \approx k \cdot f(fo,\ Vddb,\ Cpmp) \quad (5)$$

$$f(fo,\ Vddb,\ Cpmp) = fo \cdot Cpmp \cdot \{2 \cdot (ExVdd - Vdw) - Vddb\} \quad (6)$$

Therefore, when the external power-supply voltage ExVdd, clock frequency fo, and pump capacitor Cpmp are the same, it is possible to increase a current supply capacity as the voltage Vddb output from the Vddb generation circuit 50 lowers. That is, when the external power-supply voltage ExVdd and clock frequency fo are the same, it is possible to suppress the capacitance of the pump capacitor Cpmp as the Vddb serving as an output voltage is set to a smaller value in order to obtain the same power supply capacity. Because the capacitance of the pump capacitor Cpmp is proportional to the occupancy area of a pump capacitor, it is possible to decrease the occupancy area of the Vddb generation circuit 50 by lowering the second internal power-supply voltage Vddb when comparing them in the same current supply capacity.

Therefore, in the case of the embodiment of the present invention, the H-level voltage of the data-line equalizing signal DLEQ is set to the second internal power-supply voltage Vddb lower than the step-up voltage Vpp and the Vddb generation circuit 50 and the Vpp generation circuit 60 for generating the step-up voltage Vpp are set independently of each other. Thereby, when comparing the above case with the case of using the step-up voltage Vpp for the H-level voltage of the data-line equalizing signal DLEQ, it is possible to decrease the area of a voltage step-up circuit for generating the H-level voltage of the data-line equalizing signal DLEQ.

For the first embodiment, a configuration is shown in which the second internal power-supply voltage Vddb corresponding to the H-level voltage of the data-line equalizing signal DLEQ is generated by the Vddb generation circuit 50 serving as a voltage step-up circuit set in the semiconductor device 10. However, it is also possible to use a configuration in which the voltage Vddb meeting the relation between voltage levels already describe is directly supplied from an external unit. Moreover, it is possible to use a configuration in which a voltage corresponding to the first internal power-supply voltage Vdd corresponding to H level of stored data from an external unit. This configuration makes it possible to reduce the area of a voltage step-up circuit under a low-voltage operation when two types of power-supply voltages or more can be externally supplied.

Figure 4:
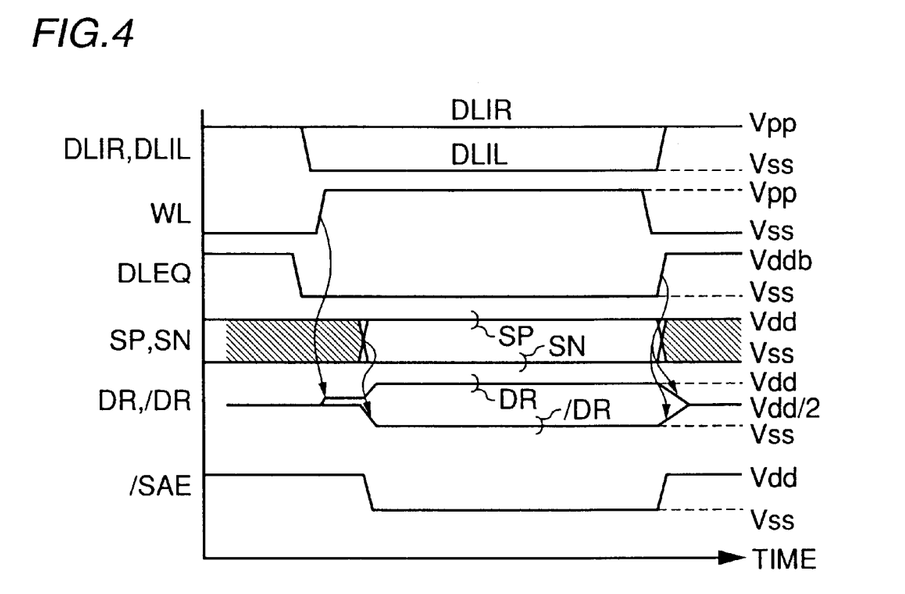
FIG. 4 is a timing chart for explaining the data read operation of the semiconductor/memory shown in FIG. 1.

Referring to FIG. 4, before data is read, the data-line equalizing signal DLEQ and control signals DLIR and DLIL are activated to the H-level voltage respectively. In the case of the semiconductor device 10, the H-level voltage of the data-line equalizing signal DLEQ is set to the second internal power-supply voltage Vddb (ExVdd<Vddb<Vpp). Therefore, even if the external power-supply voltage ExVdd is lowered, it is possible to normally execute the data-line equalizing operation before the data read operation. Thereby, each complementary data line constituting a data-line pair is set to a predetermined equal voltage (precharge voltage Vdd/2) before the data read operation.

When the data read operation is started, the transistors M1L and M2L constituting the switching circuit 7 are turned off in order to disconnect the data-line pair DLP from the sense amplifier circuit SA similarly to the case in FIG. 13. Moreover, the data-line equalizing signal DLEQ is inactivated to the L-level voltage (Vss) and the transistors M3 to M5 constituting the equalizing circuit 8 are turned off.

Under the above state, the word line WL is activated to the H-level voltage (step-up voltage Vpp). The access transistor AT is turned on in response to activation of the word line WL and the data storage node Nm is connected with the data line DR. FIG. 4 also shows a case in which the memory cell MC keeps H-level data similarly to the case of FIG. 13. Therefore, the voltage level of the data line DR slightly rises in response to turn-on of the access transistor AT. However, the voltage level of the complementary data line /DR is kept at the precharge voltage Vdd/2.

Moreover, the power-supply voltage Vdd and ground voltage Vss are supplied to the power-supply nodes SP and SN in response to activation of the sense-amplifier activation signal /SAE (L level, Vss). Thereby, the minute voltage difference generated between the data lines DR and /DR is amplified and voltage levels of the data lines DR and /DR are set to Vdd and Vss. Thus, it is possible to normally execute data read in the semiconductor device 10 even under a low-voltage operation.

Second Embodiment

In the second embodiment, configurations of a Vddb generation circuit 50 and Vpp generation circuit 60 for stepping up an external power-supply voltage ExVdd are described.

Figure 5:
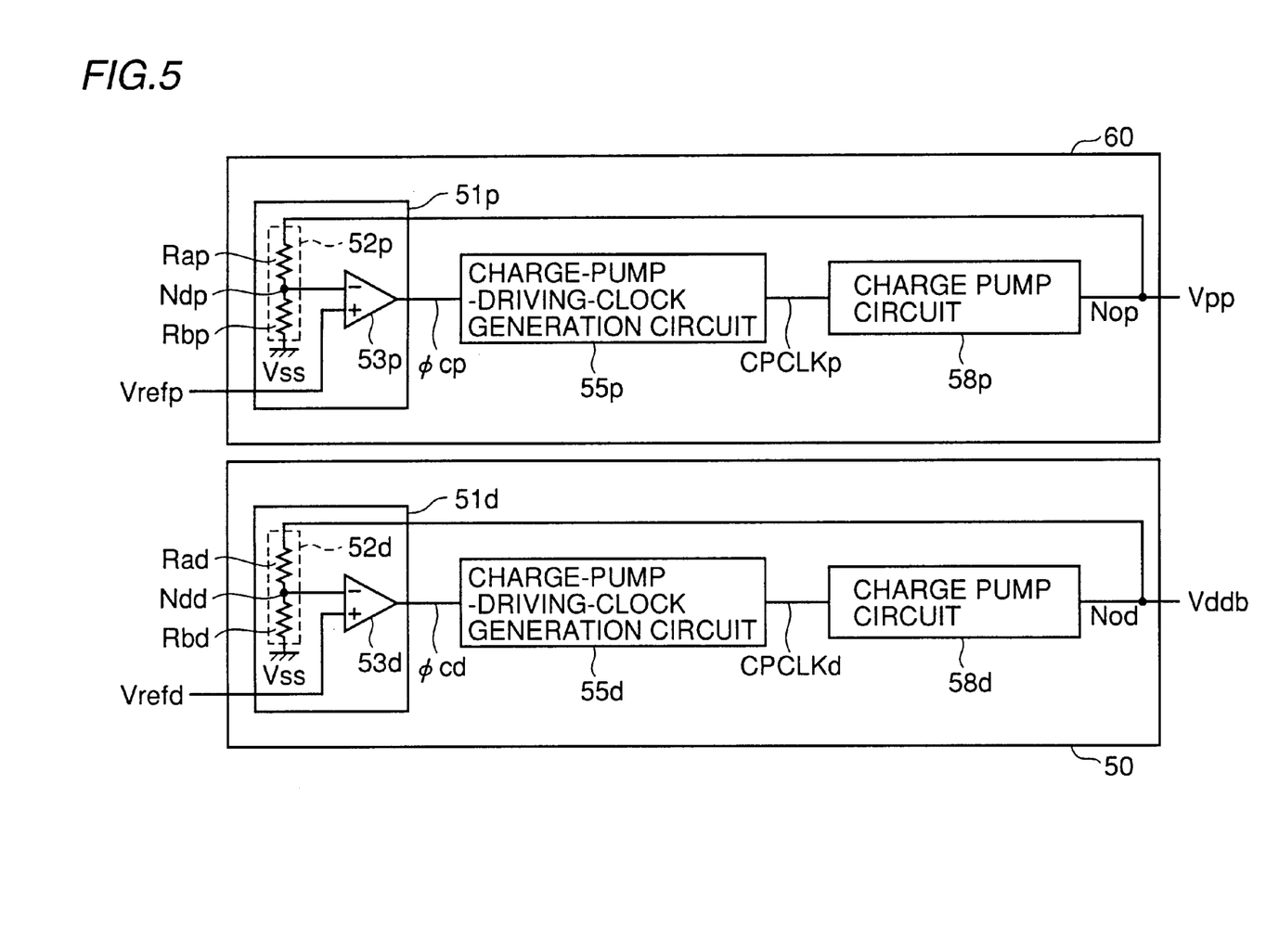
FIG. 5 is a block diagram showing a configuration of a step-up circuit group according to a second embodiment.

Referring to FIG. 5, the Vddb generation circuit 50 has a voltage detection circuit 51d, a charge-pump driving-clock generation circuit 55d, and a charge-pump circuit 58d as already described. The Vpp generation circuit 60 has a voltage detection circuit 51p, a charge-pump-driving-clock generation circuit 55p, and a charge-pump circuit 58p the similar as the Vddb generation circuit 50 does.

Configurations and operations of the voltage detection circuit 51p, charge-pump-driving-clock generation circuit 55p, and charge-pump circuit 58p are similar as those of the voltage detection circuit 51d, charge-pump-driving-clock generation circuit 55d, and charge pump circuit 58d described for FIGS. 2 and 3.

That is, the voltage detection circuit 51p activates a charge-pump activation signal Φcp when the step-up voltage Vpp lowers from a predetermined voltage level. The charge-pump-driving-clock generation circuit 55p generates a charge-pump-driving clock CPCLKp in response to activation of the charge-pump activation signal Φcp. Moreover, the charge-pump circuit 58p receives the charge-pump-driving clock CPCLKP and outputs the step-up voltage Vpp to a node Nop.

Though the voltage detection circuits 51d and 51p have the similar configuration, the reference voltages Vrefd to be input to the circuit 51 and the reference voltage Vrefp to be input to the circuit 51p are different from each other in voltage level. That is, the reference voltage Vrefd is decided in accordance with the set voltage of the second internal power-supply voltage Vddb and the voltage-division ratio of a voltage-dividing circuit 52d. However, the level of the reference voltage Vrefp is decided in accordance with the set voltage of the step-up voltage Vpp and the voltage division ratio of a voltage-dividing circuit 52p.

By using the above configuration, the Vddb generation circuit 50 and Vpp generation circuit 60 have the similar circuit layout. As a result, it is possible to design a voltage detection circuit and a charge-pump-driving-clock generation circuit for these voltage step-up circuits in common. Therefore, it is possible to shorten the development period and easily design a voltage step-up circuit.

Third Embodiment

For the third embodiment, a configuration capable of easily adjusting operating conditions of a voltage step-up circuit is described.

In the case of the third embodiment, it is described to adjust resistance values of voltage-dividing circuits 52d and 52p included in a Vddb generation circuit 50 and a Vpp generation circuit 60 as a case of adjustment of operating conditions.

As described for FIG. 5, a voltage dividing circuit 52d is set to the Vddb generation circuit 50 and a voltage-dividing circuit 52p is set to the Vpp generation circuit 60. The voltage-dividing circuit 52b divides a second internal power-supply voltage Vddb to transfer the divided voltage Vddb to a differential amplifier 53d and the voltage-dividing circuit 52p divides a step-up voltage Vpp to transfer the divided voltage Vpp to a differential amplifier 53p.

Therefore, because the voltage-diving circuit 52d must drive the input capacitor of the differential amplifier 53d and the voltage-dividing circuit 52p must drive the input capacitor of the differential amplifier 53p, it is possible to obtain a faster response by supplying more current. However, more current is supplied from the voltage-dividing circuits 52d and 52p, the amount of current required for the Vddb generation circuit 50 and Vpp generation circuit 60 is increased and thereby, power consumption is increased. Thus, the response characteristic and power consumption in the voltage detection circuits 51d and 51p are traded off each other.

Therefore, the optimum synthetic resistance value (Rad+ Rbd) of the voltage-dividing circuit 52d corresponding to the second internal power-supply voltage Vddb does not always coincide with the optimum synthetic resistance value (Rap+Rbp) of the voltage-dividing circuit 52p corresponding to the step-up voltage Vpp. That is, it is necessary to adjust a resistance value in accordance with requested specs of the response characteristic and current consumption of a voltage detection circuit.

Figure 6:
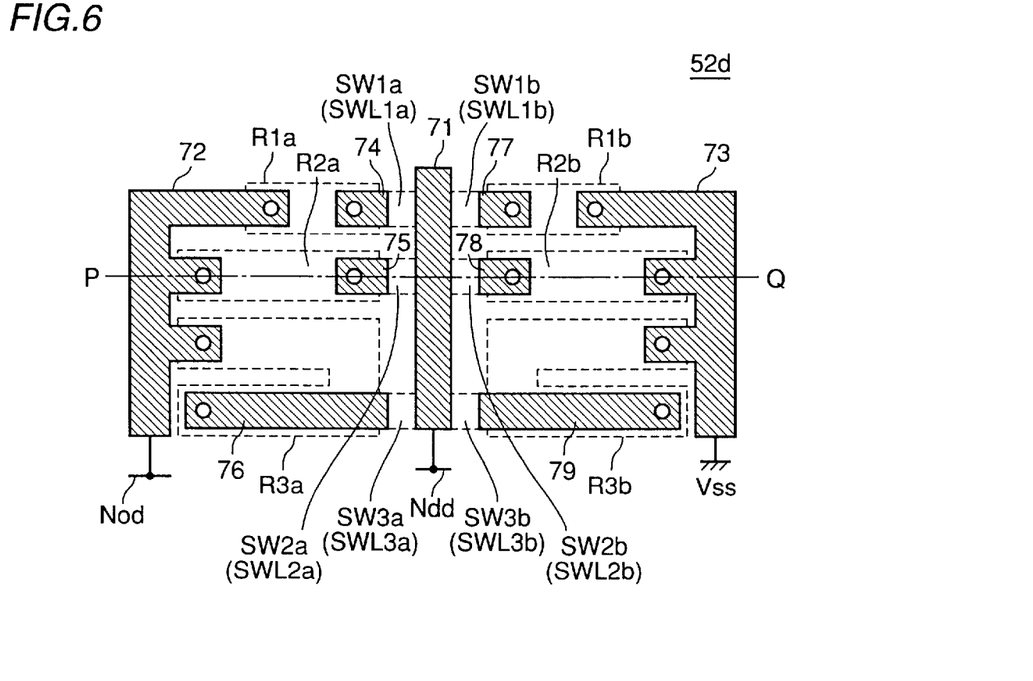
FIG. 6 is a top view showing a layout of a voltage-dividing circuit according to a third embodiment.
Figure 7:
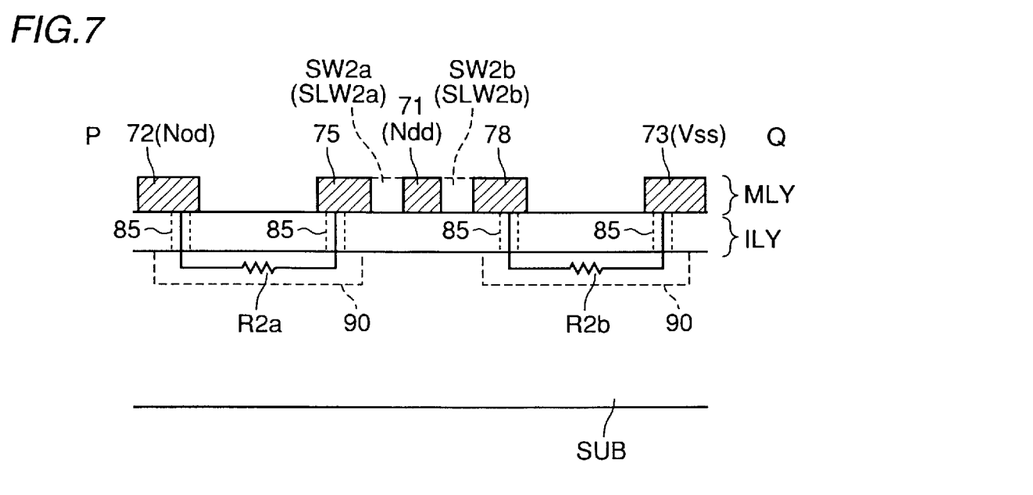
FIG. 7 is a sectional view showing the P-Q section in FIG. 6.

FIG. 6 is a top view showing a layout of a voltage division circuit according to the third embodiment. FIG. 7 is a sectional view showing the P-Q cross section in FIG. 6. Because the voltage-dividing circuits 52d and 52p have the same circuit configuration, the configuration of the typical voltage-dividing circuit 52d is described below.

Referring to FIG. 6, the voltage-dividing circuit 52d includes a wiring 71 connected with a node Ndd for transferring a voltage to be input to the differential amplifier 53d, a wiring 72 connected with an output node Nod for outputting the second internal power-supply voltage Vddb, a wiring 73 connected with a ground voltage (Vss) node, and wirings 74 to 79.

The voltage-dividing circuit 52d is further provided with resistances R1a and R1b (resistance value R), resistances R2a and R2b (resistance value 2R), and resistances R3a and R3b (resistance value 4R) which are formed on a diffusion layer. Both ends of the resistance R1a are connected to the wirings 72 and 74. Both ends of the resistance R2a are connected to the wirings 72 and 75. Both ends of the resistance R3a are connected to the wirings 72 and 76. Moreover, both ends of the resistance R1b are connected to the wirings 73 and 77. Both ends of the resistance R2b are connected to the wirings 73 and 78. Both ends of the resistance R3b are connected to the wirings 73 and 79.

FIG. 7 typically shows the resistances R2a and R2b and the wirings 71, 72, 73, 75, and 78 connected with these resistances as a P-Q sectional view.

The resistances R1a, R1b to R3a, and R3b are formed on a diffusion layer 90 on a main semiconductor substrate SUB. The wirings 71 to 79 are arranged on a wiring layer MLY formed through the main semiconductor substrate SUB and an insulating layer ILY. A resistance a wiring are connected through a contact hole 85 formed on the insulating layer ILY.

Referring to FIG. 6 again, the resistance value between the nodes Nod and Ndd (resistance component Rad in FIG. 5) is decided in accordance with selection of presence or absence of selective wirings SWL1a, SWL2a, and SWL3a serving as metallic wirings formed on switching areas SW1a, SW2a, and SW3a arranged between the wirings 71, 74, 75, and 76. For example, to form a wiring in only the switching area SW1a, only the resistance R1a is connected between the output nodes Nod and Ndd. Therefore, Rad becomes equal to R. Moreover, to respectively form a wiring between the switching areas SW1a to SW3a, the resistances R1a to R3a are connected between the output nodes Nod and Nd in parallel. Therefore, Rad becomes equal to (4/7)·R.

Similarly, it is possible to adjust the resistance value between the node Ndd and ground voltage (Vss) (resistance component Rbd in FIG. 5) in accordance with presence or absence of formation of selective wirings SWL1b, SWL2b, and SWL3b in switching areas SW1b, SW2b, and SW3b formed between the wirings 71, 77, 78, and 79.

Particularly as for sets of switching areas arranged correspondingly to resistances having the same resistance value, that is, SW1a and SW1b, SW2a and SW2b, and SW3a and SW3b, by setting presence or absence of formation of wiring in each set, it is possible to adjust the synthetic resistance (Rad+Rbd) between the output node Nod and ground voltage (Vss) node and adjust the amount of current flowing through the voltage dividing-circuit 52d while keeping the voltage division ratio {Rbd/(Rad+Rbd)} in FIG. 5 constant.

It is not preferable to arrange wirings used to adjust the above operating conditions on a diffusion layer formed on the surface of the main semiconductor substrate SUB. This is because a diffusion layer is also formed at the most initial stage of a wafer process and thereby, formation of the diffusion layer is completed about a succeeding lot advancing through the wafer process before a trouble is clarified through evaluation of initial-lot products and adjustment for removing the trouble may be impossible.

Therefore, in the case of the third embodiment, adjustment of resistance values of a voltage division circuit, that is, adjustment of operating conditions is executed by using a wiring layer formed after passing through a process of forming at least one insulating layer on a main semiconductor substrate. The wiring layer is made of, for example, polysilicon or a metal such as aluminum. Thereby, adjustment of operating conditions can be almost applied to the succeeding lot passing through the wafer process before a trouble is clarified through evaluation of the initial-lot products. That is, adjustment of operating conditions can be applied to a lot before a process of forming an upper wiring layer by changing the mask data used to form a wiring layer.

Moreover, there are some circuits in which it is preferable that they have configurations whose operating conditions can be independently adjusted as the differential amplifiers 53b and 53d in addition to a voltage-dividing circuit. Also for adjustment of these circuits, it is preferable to lay out these circuits so that operating conditions can be adjusted by selecting a wiring pattern of not only a diffusion layer formed on a main semiconductor substrate but also a wiring layer formed after passing through a process for forming an insulating layer on a main semiconductor because of the same reason.

It is also possible to apply the same adjustment to operating frequencies of the charge-pump-driving clocks CPCLKd and CPCLKp of, for example, the charge-pump-driving-clock generation circuits 55d and 55p. In this case, it is permitted to selectively set the connection between the node Nc and the inverter group shown in FIG. 3 in accordance with a wiring pattern, i.e., presence or absence of selective wirings formed on the same wiring layer.

Fourth Embodiment

Figure 8:
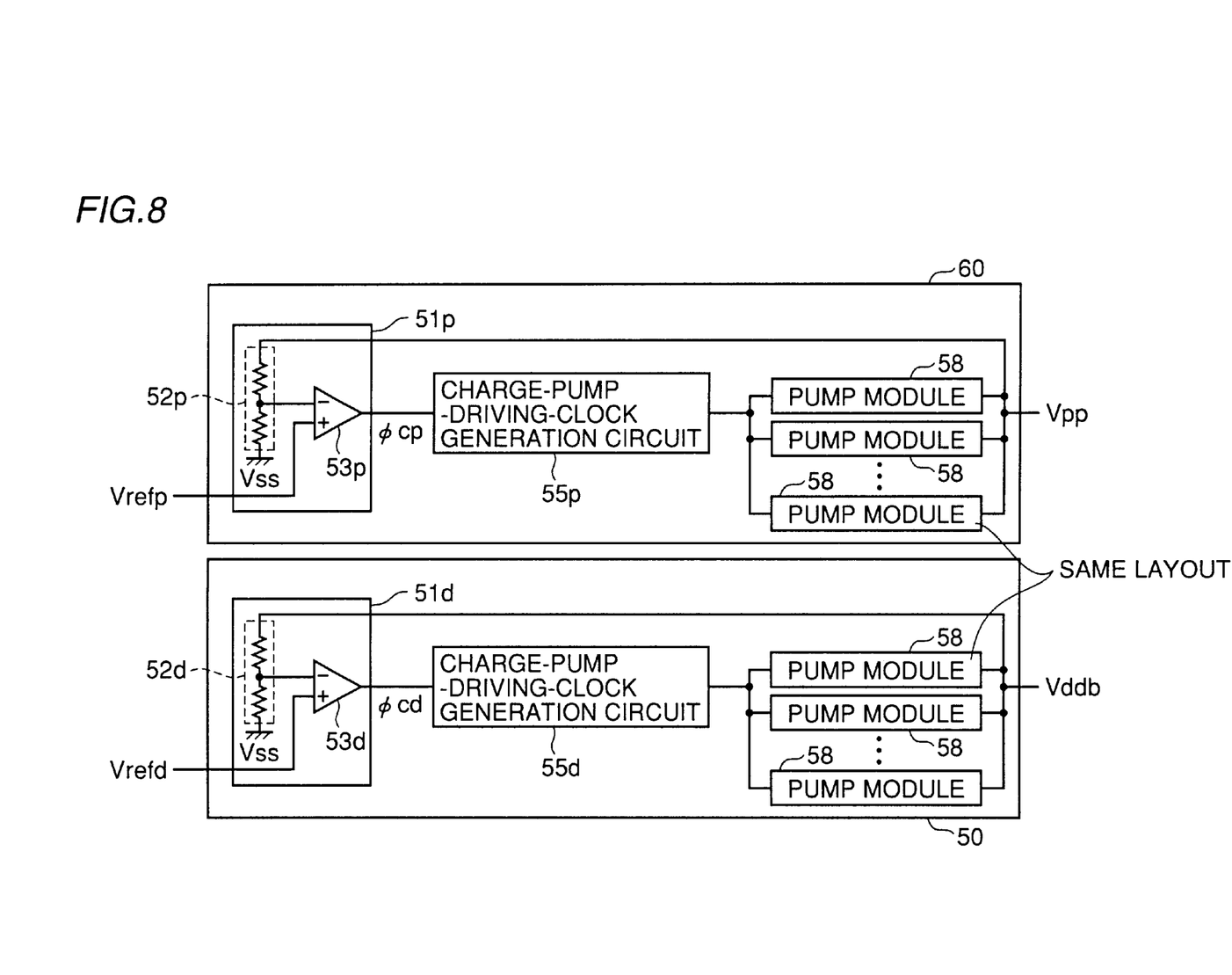
FIG. 8,is a block diagram showing a configuration of a step-up circuit group according to a fourth embodiment.

Referring to FIG. 8, a Vddb generation circuit 50 and a Vpp generation circuit 60 according to the fourth embodiment are different from the Vddb generation circuit 50 and Vpp generation circuit 60 shown in FIG. 5 in that the former circuits 50 and 60 are respectively provided with a plurality of pump modules 58 connected in parallel instead of the single charge pump circuits 58d and 58p.

The pump modules 58 included in the Vddb generation circuit 50 and Vpp generation circuit 60 have the same layout configuration. A configuration similar to the configuration of the charge pump circuit 58d described for FIG. 3 is applied to the layout configuration of each pump module 58.

Because the Vddb generation circuit 50 is different from the Vpp generation circuit 60 in operation specifications of a voltage level to be output and a necessary current supply capacity, it may be necessary to independently design the current supply capacity of a charge pump circuit. Even in this case, it is possible to meet an operation specification independently requested for each voltage step-up circuit in accordance with the design of the number of the pump modules 58 arranged on the Vddb generation circuit 50 and Vpp generation circuit 60 by using the pump modules 58 having the same layout.

Moreover, because it is possible to constitute the Vddb generation circuit 50 and Vpp generation circuit 60 by using circuits having the same layout, it is possible to shorten a development period by reducing a design load similarly to the case of the third embodiment.

Fifth Embodiment

For the fifth embodiment, a configuration of a pump module capable of easily adjusting a current supply capacity is described. The configuration of a pump module shown in the fifth embodiment can be also applied to the charge pump circuits 58d and 58p of the first to third embodiments.

Figure 9:
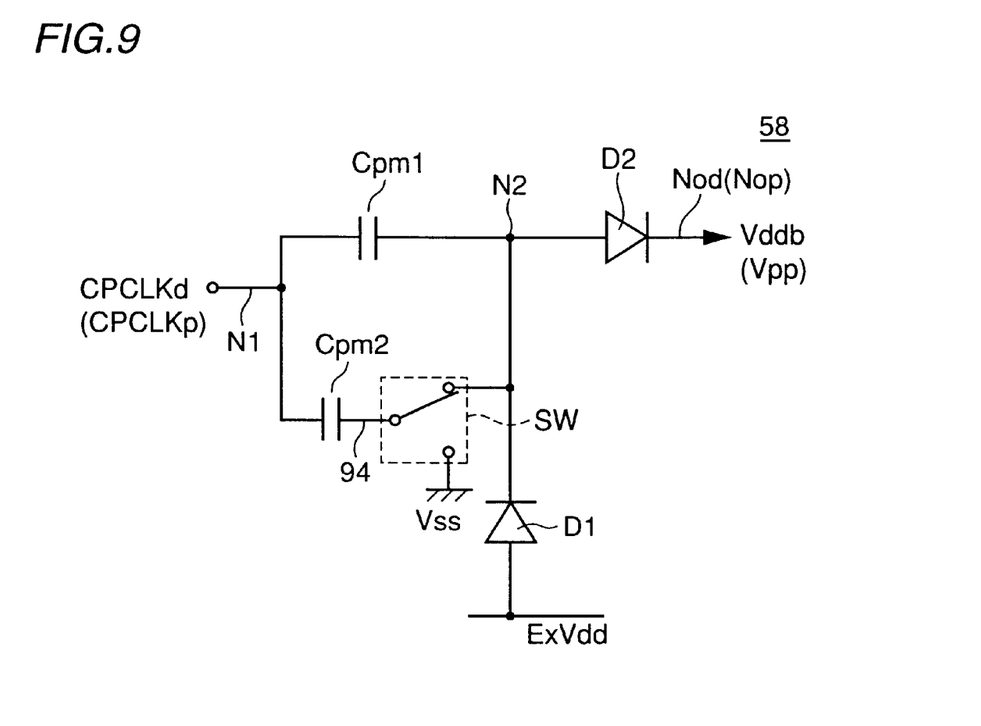
FIG. 9 is a circuit diagram showing a configuration of a pump module according to a fifth embodiment.

Referring to FIG. 9, a pump module 58 according to the fifth embodiment has a pump capacitor Cpm1 connected between nodes N1 and N2 for receiving a charge-pump-driving clock CPCLKd, a diode D1 connected by assuming a direction from an external power-supply (ExVdd) node toward the node N2 as the forward direction, a diode D2 connected by assuming a direction from the node N2 toward an output node Nod (Nop) for generating a second internal power-supply voltage Vddb (or step-up voltage Vpp) as the forward direction, a pump capacitor Cpm2 connected between the nod N1 and a wiring 94, and a switching area SW for selectively connecting the wiring 94 with either of the node N2 and ground voltage (Vss) node.

As described for the first embodiment, the current supply capacity of the pump module 58 is proportional to a pump capacitor. Therefore, in the case of a pump charge circuit according to the fifth embodiment, it is possible to set the pump capacitor of the pump module 58 to either of Cpm1 and (Cpm1+Cpm2) by selecting a connection mode in the switching area SW. That is, it is possible to independently adjust a current supply capacity for each charge pump circuit in accordance with selection of a connection mode in the switching area SW.

Figure 10:
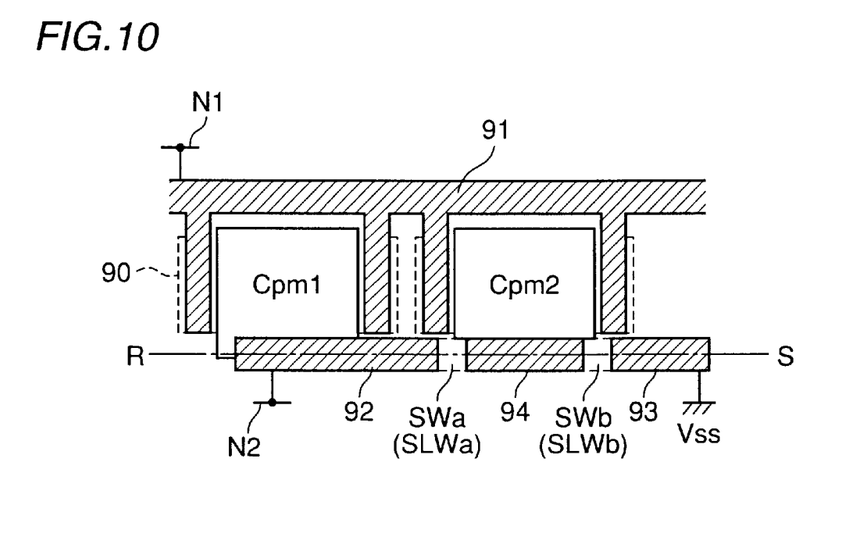
FIG. 10 is a top view showing a layout of the pump capacity and switching area shown in FIG. 9.

FIG. 10 is a top view showing the arrangement of the pump capacitor and switching area shown in FIG. 9. Moreover, FIG. 11 is a sectional view showing the R-S cross section in FIG. 10.

Referring to FIG. 10, one of electrodes of the pump capacitors Cpm1 and Cpm2 is connected with a wiring 91 electrically connected with the node N1 on the diffusion layer 90. The other of electrodes of the pump capacitor Cpm1 is connected with a wiring 92 connected with the node N2. The other of electrodes of the pump capacitor Cpm2 is connected with a wiring 94. Moreover, a wiring 93 is electrically connected with a ground voltage Vss. A switching areas SWa and SWb for forming selective wirings SLWa and SLWb are provided between the wiring 94 on one hand and the wirings 92 and 93 on the other.

Figure 11:
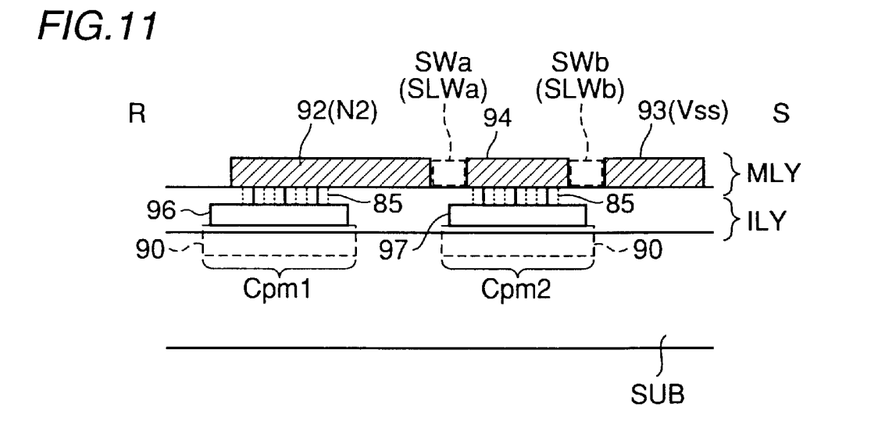
FIG. 11 is a sectional view showing the R-S section in FIG. 10.

Referring to FIG. 11, the pump capacitors Cpm1 and Cpm2 are formed on a main semiconductor substrate SUB. The wirings 92, 93, and 94 are formed on a wiring layer MLY formed after passing through a process of forming at least one insulating layer ILY or more on the main semiconductor substrate SUB.

A gate wiring 96 corresponding to the other electrode of the pump capacitor Cpm1 is connected with the wiring 92 provided to the wiring layer MLY through a contact hole 85 formed on the insulating layer ILY. Similarly, a gate wiring 97 corresponding to the other electrode of the pump capacitor Cpm2 is connected with the wiring 94 provided to the wiring layer MLY through the contact hole 85.

A selective wiring SWLa or SWLb that is a metallic wiring is formed on either of the switching areas SWa and SWb formed on a wiring layer. Thereby, the wiring 94 is connected with either of the wirings 92 and 93. Therefore, when the selective wiring SWVLa is formed in the switching area SWa, the pump capacitor Cpm2 is connected with the node N2, and the pump capacitor of a charge pump circuit is set to (Cpm1+Cpm2) and its current supply capacity increases.

However, when the selective wiring SWLb is formed in the switching area SWb, the pump capacitor Cpm2 is connected with the ground voltage Vss node. Therefore, the pump capacitor of a charge pump circuit becomes Cpm1 and its current supply capacity is suppressed.

Thus, by changing pump capacitors in accordance with a wiring pattern in a switching area formed on a wiring layer, it is possible to reflect the evaluation result of the initial lot products and properly adjust the current supply capacity of a charge pump circuit in succeeding lot products similarly to the case of the third embodiment. For example, by forming a wiring in the switching area SWa, setting the pump capacitor of a charge pump circuit to (Cpm1+Cpm2), when it is clarified that the current supply capacity of the charge pump circuit is excessive, it is possible to adjust the current supply capacity of the charge pump circuit by changing the mask data of a wiring layer so as to form a wiring in not the switching area SWa but the switching area SWb in the succeeding lot.

In the case of the fifth embodiment, a configuration capable of adjusting the current supply capacity of a charge pump circuit in two stages is shown. However, it is also possible to adjust the current supply capacity in more multistage by increasing the number of pump capacitors to be arranged and similarly setting corresponding switching areas.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device operating under reception of an external power-supply voltage comprising:
   first and second data lines for transmitting a data signal having two data levels one of which corresponds to a first voltage; and
   a plurality of memory cells for holding said data signal, each of said plurality of memory cells including
      a storage node for storaging the data level of said data signal,
      a data transfer gate for electrically connecting said storage node with one of said first and second data lines in response to activation of a word line set to a second voltage higher than said first voltage, and
      a data-line equalizing circuit for setting said first and second data lines to one same predetermined voltage in response to a control signal, said control signal being set to a third voltage higher than said external power-supply voltage and lower than said second voltage under activation.

2. The semiconductor device according to claim 1, wherein at least one of said first to third voltages is externally supplied.

3. The semiconductor device according to claim 1, further comprising:
   a first internal-voltage generation circuit for receiving said external power-supply voltage and generating said second voltage; and
   a second internal-voltage generation circuit for receiving said external power-supply voltage and generating said third voltage.

4. The semiconductor device according to claim 3, wherein
   each of said first and second internal-voltage generation circuits includes,
      a charge pump section for generating corresponding one of said second and third voltages in accordance with charge pump operation,
      a driving-clock generation section for generating a driving clock of said charge pump section,
      a voltage division circuit for dividing corresponding one of said second and third voltages, and
      a voltage detection circuit for instructing said driving-clock generation section to execute and stop generation of said driving clock in accordance with comparison between an output of said voltage division circuit and a reference voltage, and
      said reference voltage input to said first internal-voltage generation circuit and said reference voltage input to second internal-voltage generation circuit are independently set correspondingly to said second and third voltages.

5. The semiconductor device according to claim 4, wherein
   each of said first and second internal-voltage generation circuits includes,
      a plurality of circuit elements formed on a semiconductor substrate,
      a plurality of wirings for connecting said circuit elements each other, formed on a wiring layer formed on said semiconductor substrate through at least one insulating layer, and
      a selective wiring formed in either of first and second connection change areas provided between one wiring and two other wirings among said plurality of wirings and selected in accordance with operating conditions of said first and second internal-voltage generation circuits to electrically connect corresponding wirings each other.

6. The semiconductor device according to claim 5, wherein
   selection of the area in which said selective wiring is formed is executed by changing mask data used to form said wiring layer.

7. The semiconductor device according to claim 3, wherein
   each of said first and second internal-voltage generation circuits includes a plurality of charge pump sections connected in parallel,
   each of the charge pump sections generates corresponding one of said second and third voltages in accordance with said charge pump operation,
   each of said first and second internal-voltage generation circuits further includes a driving-clock generation section for generating driving clocks of said charge pump sections, a voltage division circuit for dividing corresponding one of said second and third voltages, and a voltage detection circuit for instructing said driving-clock generation section to execute and stop generation of said driving clocks in accordance with comparison between an output of said voltage division circuit and a reference voltage, said reference voltage input to said first internal-voltage generation circuit and said reference voltage input to second internal-voltage generation circuit are independently set correspondingly to said second and third voltages, and said charge pump sections included in said first and second internal-voltage generation circuits have same circuit configuration.

8. The semiconductor device according to claim 7, wherein the number of charge pump sections arranged in said first internal-voltage generation circuit is different from the number of charge pump sections arranged in said second internal-voltage generation circuit.

9. The semiconductor device according to claim 7, wherein each of said charge pump sections includes,
a pump capacitor section connected between first and second internal nodes for receiving said driving clocks and capable of changing capacitance values,
a first rectifying element electrically connected in a forward direction from a node for supplying said external power-supply voltage to said second internal node, and
a second rectifying element electrically connected in a forward direction from said second internal node to an output node for outputting corresponding one of said second and third voltages.

10. The semiconductor device according to claim 9, wherein said pump capacitor section includes,
a first capacitive element connected between said first and second internal nodes,
a second capacitive element one of whose electrodes is connected with said first internal node, and
a capacity adjustment section set between the other electrode of said second capacitive element and said second internal node to connect or disconnect the other electrode with or from said second internal node.

11. The semiconductor device according to claim 9, wherein said pump capacitor section has first and second capacitive elements formed on a semiconductor substrate,
one electrode of said first and second capacitive elements is connected with said first internal node, and
said pump capacitor section further includes,
a first wiring formed on a wiring layer formed on said main semiconductor substrate through at least one insulating layer and electrically connected with the other electrode of said first capacitive element and said second internal node,
a second wiring formed on said wiring layer and electrically connected with the other electrode of said second capacitive element,
a third wiring formed on said wiring layer and electrically connected with a third internal node, and
a selective wiring formed on selected one of first and second connection change areas respectively formed between said second and first, and said second and third wirings to electrically connect corresponding wirings each other.

12. The semiconductor device according to claim 11, wherein selection of the area in which said selective wiring is formed is executed by changing mask data used to form said wiring layer.

13. The semiconductor device according to claim 1, wherein said data-line equalizing circuit includes
a first N-channel field-effect transistor electrically connected between said first data line and a node for supplying said predetermined voltage,
a second N-channel field-effect transistor electrically connected between said second data line and the node for supplying said predetermined voltage, and
a third N-channel field-effect transistor electrically connected between said first and second data lines, and
each of said first, second and third N-channel field-effect transistors has a gate to which said equalizing control signal is input.

14. The semiconductor device according to claim 1, wherein said memory cells are separately arranged in a plurality of areas,
said first and second data lines are provided correspondingly to each of said plurality of areas, and
said semiconductor device further comprises
a first switching circuits provided corresponding to each of said plurality of areas, for electrically connecting a first node and corresponding one of said first data lines in response to a control signal set to said second voltage under activation,
a second switching circuits provided corresponding to each of said plurality of areas, for electrically connecting a second node and corresponding one of said second data lines in response to said control signal, and
a sense-amplifier circuit for amplifying a voltage difference between said first and second nodes wherein said control signal is activated in selected one of said plurality of areas.

15. The semiconductor device according to claim 14, wherein said data-line equalizing circuit sets said first and second data lines electrically connected with said first and second nodes to said predetermined voltage.

16. A semiconductor device comprising:
a memory cell including a capacitor for storing charges and an access transistor;
a data line pair including two data lines, one of said two data lines connected to said memory cell;
a word line connected to the gate of said access transistor, being set to a first voltage under activation;
a sense-amplifier circuit for amplifying a small voltage difference between said two data lines, said small voltage difference being generated representing the stored charges in said capacitor in response to the activation of said word line, to a voltage difference between the ground voltage and a second voltage; and
a data-line equalizing circuit for setting each of said two data lines to one same predetermined voltage in response to a control signal, said control signal being set to a third voltage higher than an external power-supply voltage and lower than said first voltage under activation.

* * * * *